(12) United States Patent
Short (10) Patent No.: US 8,229,125 B2
(45) Date of Patent: Jul. 24, 2012

(54) ADJUSTING DYNAMIC RANGE OF AN AUDIO SYSTEM

(75) Inventor: William R. Short, Southborough, MA (US)

(73) Assignee: Bose Corporation, Framingham, MA (US)

( * ) Notice: Subject to any disclaimer, the term of this patent is extended or adjusted under 35 U.S.C. 154(b) by 795 days.

(21) Appl. No.: 12/367,095

(22) Filed: Feb. 6, 2009

(65) Prior Publication Data
US 2010/0202631 A1   Aug. 12, 2010

(51) Int. Cl.
*H03G 3/20*  (2006.01)

(52) U.S. Cl. .............. 381/56; 381/57; 381/58; 381/104; 381/108

(58) Field of Classification Search .................... 381/56, 381/57, 58, 104, 108
See application file for complete search history.

(56) References Cited

U.S. PATENT DOCUMENTS

| | | | |
|---|---|---|---|
| 4,054,849 A | 10/1977 | Yamada | |
| 4,061,875 A | 12/1977 | Freifeld et al. | |
| 4,123,711 A | 10/1978 | Chow | |
| 4,455,675 A | 6/1984 | Bose et al. | |
| 4,494,074 A | 1/1985 | Bose | |
| 4,641,344 A | 2/1987 | Kasai et al. | |
| 4,868,881 A | 9/1989 | Zwicker et al. | |
| 4,891,605 A | 1/1990 | Tirkel et al. | |
| 4,944,018 A | 7/1990 | Bose et al. | |
| 4,985,925 A | 1/1991 | Langberg et al. | |
| 5,034,984 A | 7/1991 | Bose | |
| 5,208,866 A | 5/1993 | Kato et al. | |
| 5,388,185 A | 2/1995 | Terry et al. | |
| 5,434,922 A | 7/1995 | Miller et al. | |
| 5,615,270 A | 3/1997 | Miller et al. | |
| 5,666,426 A | 9/1997 | Helms | |
| 5,682,463 A | 10/1997 | Allen et al. | |
| 5,832,444 A | 11/1998 | Schmidt | |
| 5,907,622 A | 5/1999 | Dougherty | |
| 6,072,885 A | 6/2000 | Stockham, Jr. et al. | |
| 6,236,731 B1 | 5/2001 | Brennan et al. | |
| 7,050,966 B2 | 5/2006 | Schneider et al. | |
| 7,317,802 B2 | 1/2008 | Wurtz | |
| 2002/0086072 A1 | 7/2002 | Allen et al. | |
| 2003/0002659 A1 | 1/2003 | Erell | |

(Continued)

FOREIGN PATENT DOCUMENTS

CN   1289500 A   3/2001

(Continued)

OTHER PUBLICATIONS

CN Office Action dated Oct. 20, 2010 for CN Appl. No. 200680023332.5.

(Continued)

*Primary Examiner* — Thanh V Pham (57) ABSTRACT

An audio reproduction system substantially fits the dynamic range of recorded and broadcast music (or other type of audio content) into a desired output dynamic range, bounded by the available dynamic range of the listening environment. In some scenarios the output dynamic range may be defined as a function of the ambient noise level present in the environment and the maximum output capabilities of audio system. A listener may adjust the desired prominence of the program with a user control, with foreground (louder and more dynamic) as one extreme and background (quieter and less dynamic) as the other extreme. A control to adjust prominence, when used to provide background reproduction, may reduce the average volume of a reproduced signal and fit the input signal dynamic range into a suitably smaller but desired output signal dynamic range.

15 Claims, 7 Drawing Sheets

U.S. PATENT DOCUMENTS

| | | | |
|---|---|---|---|
| 2003/0064746 A1 | 4/2003 | Rader et al. | |
| 2003/0118197 A1 | 6/2003 | Nagayasu et al. | |
| 2003/0198357 A1 | 10/2003 | Schneider et al. | |
| 2005/0175194 A1 | 8/2005 | Anderson | |
| 2005/0226444 A1 | 10/2005 | Coats | |
| 2006/0126865 A1 | 6/2006 | Blamey et al. | |
| 2006/0251261 A1* | 11/2006 | Christoph | 381/1 |
| 2006/0262938 A1 | 11/2006 | Gauger et al. | |
| 2008/0181422 A1 | 7/2008 | Christoph | |

FOREIGN PATENT DOCUMENTS

| | | |
|---|---|---|
| EP | 0661858 | 7/1995 |
| EP | 1003154 A2 | 5/2000 |
| EP | 1720249 A1 | 11/2006 |
| WO | 9847315 | 10/1998 |
| WO | 9922366 A2 | 5/1999 |
| WO | 0019686 | 4/2000 |
| WO | 00/30264 A1 | 5/2000 |
| WO | 0139370 A2 | 5/2001 |
| WO | 01/45082 | 6/2001 |
| WO | 2005011111 | 2/2005 |
| WO | 2006125061 A1 | 11/2006 |
| WO | 2007113487 A1 | 10/2007 |

OTHER PUBLICATIONS

International Search Report dated Feb. 21, 2011 for PCT/US2009/066321.
Invitation to Pay Additional Fees dated Oct. 10, 2010 for PCT/US2009/066321.
Notice of Invitation to Pay Additional Fees dated Apr. 6, 2010 in PCT/US2010/021571.
Partial International Search Report and Written Opinion dated Oct. 22, 2010 for Int. Appl. No. PCT/US2009/066321.
International Search Report and Written Opinion dated Sep. 17, 2010 for Int. Appln. No. PCT/US2010/021571.
Hanagami, Nathan Fox. "Adding DSP Enhancement to the BOSE Noise Canceling Headphones", Mather Thesis. Massachusetts Institute of Technology, May 18, 2005.
EP Office Action dated Aug. 20, 2008 in counterpart EP 06760069.2.
Dan Race, New Plantronics Bluetooth Headset Delivers Breakthrough Sound Quality on Both Ends of the Conversion, Las Vegas, NV, International CES, Jan. 8, 2004, http//www.plantronics.com/north_america/en_US/press/release/index.jhtml?id=pr_20040108_002..., downloaded Dec. 19, 2005.
M3500 Bluetooth Headset, Plantronics, Digitally Enhanced Voice with Audio IQ Technology, Printed Feb. 6, 2004 PS533.
International Preliminary Report on Patentability dated Nov. 29, 2007 for PCT/US2006/019193.
International Search Report and Written Opinion dated Oct. 4, 2006 for PCT/US2006/019193.
U.S. Appl. No. 12/342,759, filed Dec. 23, 2008.
JP Office Action dated Oct. 4, 2011 for JP Appl. No. 2008512496.
CN Office Action dated Jul. 12, 2011 for CN Appln. No. 200680023332.5.
CN Office Action dated Nov. 8, 2011 for CN Appln. No. 200680023332.5.

* cited by examiner

ADJUSTING DYNAMIC RANGE OF AN AUDIO SYSTEM

BACKGROUND

This description relates to adjusting dynamic range for audio reproduction signals.

In many situations in which people listen to recorded or broadcast speech or music, it is difficult to hear both the loud portions of the program and the soft portions with the same volume control setting. In a noisy listening environment (e.g., the passenger cabin of an automobile), when the loud passages are turned up high enough to be audible over the noise, the soft passages are masked by noise, and are inaudible. This situation is especially problematic with orchestral music, which can have a dynamic range of over 80 dB. In quiet listening situations (e.g., listening at home late at night), when soft passages are set at a comfortable background listening level, the loud passages can be loud enough to wake other family members or neighbors.

Furthermore, constantly changing noise levels provide an even more disagreeable listening experience. In a moving automobile, opening a window can drastically change the level and spectrum of the noise in a matter of a second. In a restaurant playing background music for patrons, the noise may noticeably change from the beginning of the evening to the end, as more and louder patrons fill the restaurant.

SUMMARY

In one aspect, a method of adjusting a dynamic range of an audio system includes providing an audio system that includes variable values for at least the following parameters: (i) an output signal dynamic range, (ii) a maximum output signal level, and (iii) a minimum output signal level; receiving a user specified value for at least a first of the parameters; determining a value of a second of the parameters, wherein the determined value of the second parameter is based at least in part on the user-specified value of the first parameter, and applying a gain to an input signal as a function of time to compress the input signal to fit within a value set for the output signal dynamic range parameter.

Implementations may include one or more of the following features. The first parameter specified by the user is the maximum output signal level. The first parameter specified by the user is the maximum output signal dynamic range. The minimum output signal level is based on the level of ambient noise present in the listening environment. The level of ambient noise present in the environment is either directly sensed by a microphone or is estimated. The input signal is divided into a plurality of frequency bands and a gain is applied to the input signal in each frequency band to compress the input signal to fit within an output signal dynamic range set for each frequency band. The gain applied to a frequency band is adjusted by a feedback signal. The feedback signal is based on a time average of the gain applied to the frequency band. A factor is applied to the time averaged gain. The feedback signal is based on averaging applied gains across adjacent frequency ranges.

In one aspect, a method for controlling operation of an audio system includes simultaneously controlling with a single control two of the following three parameters: (i) an output signal dynamic range, (ii) a maximum output signal level, and (iii) a minimum output signal level. Implementations may include simultaneously controlling the output signal dynamic range and the maximum output signal level.

In one aspect, a control for controlling operation of an audio system includes a single control that simultaneously controls two of the following three parameters: (i) an output signal dynamic range, (ii) a maximum output signal level, and (iii) a minimum output signal level. Implementations may include a control that simultaneously controls the output signal dynamic range and the maximum output signal level.

In one aspect, an audio system includes a user control for receiving a user specified value for at least one of a plurality of parameters consisting of (i) an output signal dynamic range, (ii) a maximum output signal level, and (iii) a minimum output signal level; a processor for determining a value of a second of the parameters, wherein the determined value of the second parameter is based at least in part on the user-specified value of the first parameter, and gain determining elements for determining a gain to apply to an input signal to compress the input signal to fit within a value set for the output signal dynamic range parameter, wherein the gain is a function of time.

These and other aspects and features and various combinations of them may be expressed as methods, apparatus, systems, means for performing functions, program products, and in other ways.

Other features and advantages will be apparent from the description of the claims.

DESCRIPTION

Figure 1:
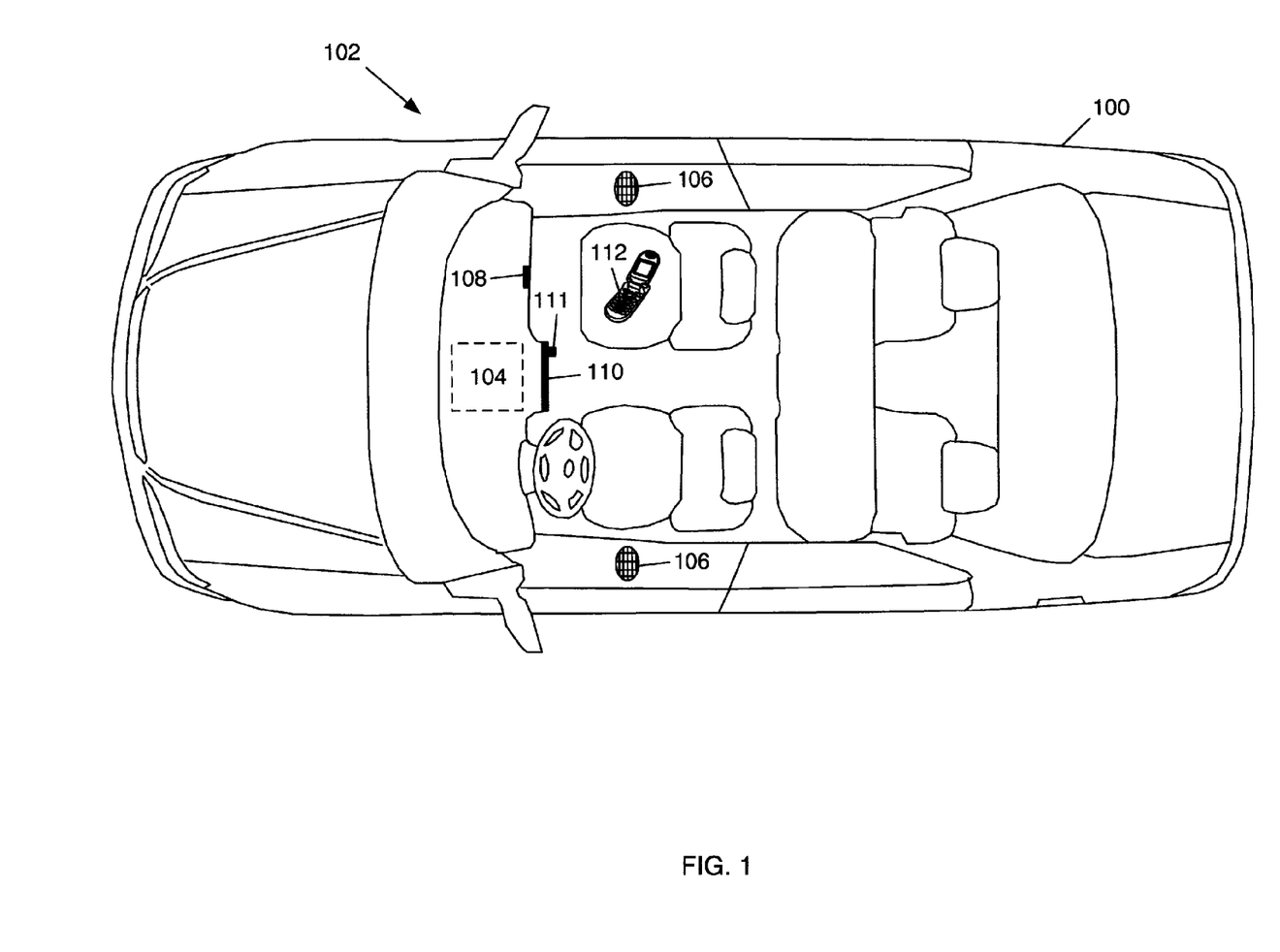
FIG. 1 is a top view of an automobile.

Referring to FIG. 1, an automobile 100 includes an audio reproduction system 102 capable of automatically adjusting dynamic range, for example, as a function of time and frequency. While, the system 102 is illustrated as being implemented in the automobile 100, the system may be implemented in other types of vehicles (e.g., airplanes, buses, etc.) and environments (e.g., residences, business offices, restaurants, sporting arenas, etc.) that are susceptible to noise. In some arrangements, the system 102 may also be used to adjust dynamic range for listening environments absent significant ambient noise. For example, a soundtrack may be adjusted for late-night movie viewing so as not to disturb non-viewers (e.g., sleeping children) while still providing audible content.

The audio reproduction system 102 substantially fits the dynamic range of recorded and broadcast music (or other type of audio content) into a desired output dynamic range, bounded by the available dynamic range of the listening environment. In some scenarios the output dynamic range may be defined as a function of the ambient noise level present in the environment and the maximum output capabilities of audio system. A listener may adjust the desired prominence of the program with a user control, with foreground (louder and more dynamic) as one extreme and background (quieter and less dynamic) as the other extreme. A control to adjust prominence, when used to provide background reproduction, may reduce the average volume of a reproduced signal and fit the input signal dynamic range into a suitably smaller but desired output signal dynamic range. For example, an output signal dynamic range of 10 dB may be provided, however, larger or smaller ranges (e.g., between 0 and 30 dB) may be chosen for effective background operation. A prominence control may adjust the amount the maximum desirable output signal level is allowed to exceed the ambient noise level for example for background operation, allowing the maximum output signal level to exceed the ambient noise level by 10 dB, however, larger or smaller ranges (e.g. between 0 and 30 dB) may be chosen.

A listener may adjust the prominence of the program for foreground operation. Adjustments for foreground reproduction may increase the average volume of a reproduced signal and fit the input signal dynamic range into a suitably larger desired output signal dynamic range such as 70 dB (although larger or smaller ranges may be chosen for effective foreground operation, such as within 0 dB to ±30 dB of the input signal dynamic range).

As the noise level changes, the fit of the dynamics of the music to the desired output signal dynamic range is varied automatically, so the desired prominence of the music over the noise remains constant. In one arrangement, the audio reproduction system 102 dynamically changes the level and the compression ratio in multiple frequency bands, which causes the spectrum of the music to dynamically change. Thereby, the desired music signal always remains unmasked above the undesired noise.

In this arrangement, dynamic range may be adjusted to counter the effects of one or more noise sources that are internal to the automobile 100 (e.g., engine noise, fans, exhaust noise, wind noise, etc.) and/or external (e.g., other automobiles, city streets, construction sites, etc.) to reproduce recognizable audio content (e.g., music, public announcements, conversations, etc.) for a listener. For example, significant ambient noise may saturate the automobile 100 interior so that reproduced music is inaudible or severely masked by the noise. Various types of other audio signals may also be considered as noise. For example, audio signals present in the automobile 100 interior (e.g., a cellular telephone being used by a passenger) may be considered as noise by the driver of the automobile. By adjusting the dynamic range provided by the system 102, the music may be reproduced to overcome the ambient noise levels.

As represented in FIG. 1, the system 102 includes an audio processing device 104 that processes audio signals for reproduction. In particular, the audio processing device 104 adjusts dynamic range for reproducing audio signals based upon the internal and external noise present in the interior of the automobile 100. In some arrangements, the functionality of the audio processing device 104 may be incorporated into audio equipment such as an amplifier or the like (e.g., a radio, a CD player, a DVD player, a digital audio player, a hands-free phone system, a navigation system, a vehicle infotainment system, etc.). Additional audio equipment may also be included in the system 102, for example, a pair of speakers 106 and an in-dash microphone 108 provide transducers for respectively reproducing and collecting audio signals. Systems may include additional speakers located throughout the vehicle. Microphones may be located in headliners, pillars, seatbacks or headrests, or other locations convenient for sensing sound within the vehicle. Additionally, an in-dash control panel 110 provides a user interface for initiating system operations and exchanging information such as allowing a user to control settings and providing a visual display for monitoring the operation of the system. In this implementation, the in-dash control panel 110 includes a control knob 111 to allow a user input for controlling prominence adjustments, volume adjustments, and the like.

To adjust audio signal processing such as defining a desired output signal dynamic range, the audio processing device 104 may use information from a user (e.g., a selected prominence level, a selected volume level, etc.) along with environmental information. For example, the ambient noise present within the automobile interior, which may interfere with an occupant's ability to hear audio, may be sensed by the in-dash microphone 108 and used to adjust the output signal dynamic range. Rather than the in-dash microphone 108 (or multiple microphones incorporated in the automobile), the audio system 102 may use one or more other microphones present within the interior of the automobile 100. For example, a microphone of a cellular phone 112 (or other type of handheld device) may be used to collect ambient noise. By wirelessly or hardwire connecting the cellular phone 112, via the in-dash control panel 110, the audio processing device 104 may be provided an ambient noise signal by a cable (not shown), a Bluetooth connection, or other similar connection technique. Ambient noise may also be estimated from other techniques and methodologies such as inferring noise levels based on engine RPM or vehicle speed. The state of windows, sunroofs, etc. (e.g., open or closed), may also be used to provide an estimate of ambient noise. Location and time of day may be also used in noise level estimates, for example, a global positioning system may used to locate the position of the car 100 (e.g., in a city) and a clock may used (e.g., noise is greater during daytime).

Figure 2:
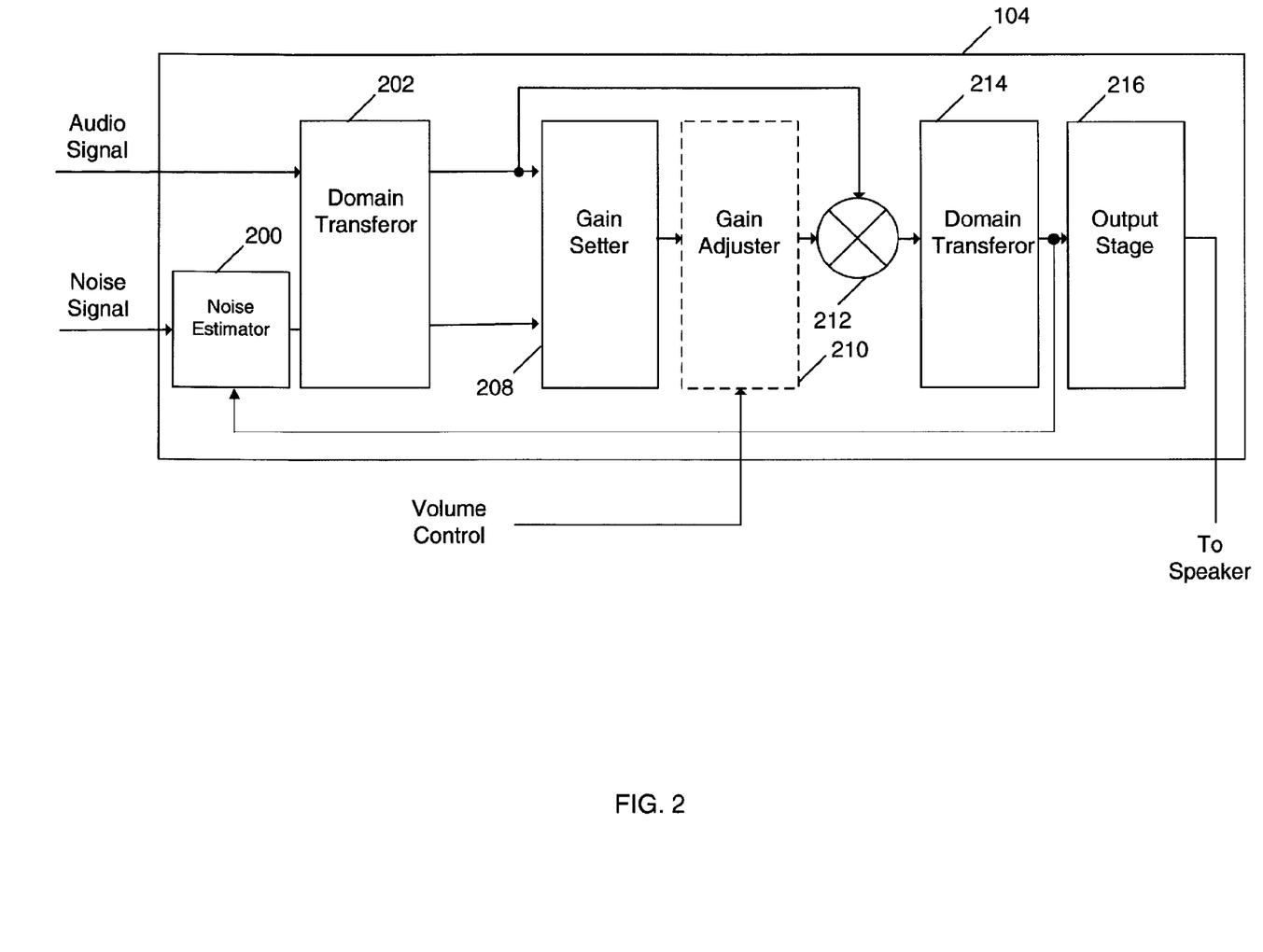
FIG. 2 is a block diagram of an audio processing device.

Referring to FIG. 2, exemplary components of the audio processing device 104 are presented for processing audio signals (e.g., adjusting dynamic range for audio reproduction in a noisy environment, adjusting dynamic range for audio reproduction in a quiet environment, etc.). An audio signal (e.g., signals from a radio tuner, a CD unit, an MP3 decoder, etc.) and a noise signal (e.g., signal from in-dash microphone 108, cellular telephone 112, etc.) are respectively received by the audio processing device 104. The noise signal is processed by a noise estimator 200 that provides an estimate of the noise in the listening environment. Since the microphone (or microphones) collects both reproduced music signals and undesired ambient noise signals, the noise estimator 200 needs to estimate the noise over a relatively large frequency range while substantially ignoring the music signal present. In one arrangement, a least means square (LMS) adaptive filter is incorporated into the noise estimator 200. In some arrangements, noise is estimated by subtracting a filtered reference signal from the microphone signal, where the reference signal used is representative of the music playing in the vehicle. As described below, one or more representative audio signals may be provided to the noise estimator 200 from one or more components of the audio processing device 104, for example, for use by an adaptive filter. In some arrangements, processed audio channel signals being reproduced within the environment are summed to form a reference input. The reference input may be filtered by the adaptive filter, and the output of the filter may be subtracted from the microphone signal. Coefficients of the adaptive filter may be updated in a dynamic manner over time to reduce the audio signal artifacts in the subtracted result while retaining the estimated ambient noise.

A domain transferor 202 processes the audio signal and the estimated noise signal by transforming the signals from one domain into another by using one or more techniques. For example, frequency, wavelet, numerous time/frequency distributions or other types of domain transformations may be executed by the domain transferor 202. In some arrangements the audio and estimated noise signals are transformed from the time domain into the frequency domain by using a fast Fourier transform (FFT) or other similar transform technique. Additionally, the domain transferor 202 may segment the frequency domain representations of the estimated noise and audio signals. For example, frequency spectrums may be segmented into small bands (e.g., 5 Hz, 10 Hz, 100 Hz bandwidth) or relatively large bands (e.g., 1000 Hz bandwidth). Band segmentation may also be based on logarithmic scales (e.g., log-spaced frequency bands, such as ⅓ octave, 1/20 octave, 1/10 octave, octave, etc.), human physiology (e.g., critical bands that are based on the human auditory system) or other similar basis. Typically the audio signal frequency bands are substantially equivalent to the noise signal frequency bands, however, in some arrangements, the bands may be different.

For each frequency band, a gain setter 208 processes the audio and estimated noise levels along with a signal that represents a desired prominence or volume level (e.g., provided from the in-dash control panel 110) and determines one or more appropriate gains to apply to the audio signal. In some arrangements additional data such as a desired or arbitrary minimum audio level to be maintained relative to the noise level may be used to determine gains for the audio signal. A predefined dynamic range value may also be provided to the gain setter 208 for gain determination. For example, for background listening, the output signal dynamic range may be predetermined, for example, in a range between 0 and 20 dB (e.g., 6 dB). Gain may be determined in a dynamic manner, for example, gains may vary with time. For example, the gain setter 208 may slow the rate at which the gain settings for one or more frequency bands may be altered. Slowing the rate at which gains may be changed may prevent audible artifacts from being introduced into a reproduced audio signal. Gain changes may be constrained to similar rates, or in some implementations, one type of gain change (e.g., increasing gains) may be more constrained than another type (e.g., decreasing gains). For example, gains may be allowed to increase at a rate of 0.05 dB per frame, and to decrease at a rate of 2 dB per frame, in which a frame is equivalent to 512/44,100 seconds (0.012 seconds). In this example, 512 represents the number of samples in a frame and 44,100 represents the sample rate in units of samples per second. Other rates are also possible if desired. In some scenarios, rates substantially different from these may be incorporated. For example, rapid gain increases and relatively slower gain decreases may be allowed. In other embodiments, for example, after a substantial period absent content in the input signal, the appearance of audible content in the input signal may trigger the gain to be allowed to change at much faster rates. In some embodiments, the determined gain of a frequency band may be dependent upon gain changes in adjacent frequency bands. For example, if the gain in a frequency band adjacent or near to a frequency band of interest is changing rapidly, the gain in the frequency band of interest may be constrained to change more slowly than it otherwise would be allowed to change.

By determining one or more gains, the gain setter 208 may compress or expand the dynamic range of the audio signals. For example, signals may be compressed such that a musical piece with an 80 dB dynamic range is compressed into a 10 dB output dynamic range for quiet listening as background music.

In environments lacking significant ambient noise, a listener may wish to reduce the volume of excessively loud audio passages (e.g., a musical crescendo, a car crash and explosion) to acceptable levels while still allowing softer audio passages (e.g., a woodwind instrument solo, whispering characters) to remain audible. In some arrangements, the system maps the input signal dynamic range into a relatively small output signal dynamic range that sits above an ambient noise level (that is relatively low). In effect, the system adjusts signal levels to maintain a small "reproduced signal to ambient noise" ratio within the environment. In general, music has a power spectrum that decreases in magnitude with increasing frequency (e.g., for frequencies above 200 Hz). Since music has less signal energy at high frequencies than at lower frequencies, audio processing device 104 will tend to apply more gain at high frequencies than at lower frequencies. By applying gain in such a fashion, an undesirable slope may be introduced into the frequency spectrum of the reproduced output signal. At particular instants, applied gains may be represented with any shape across frequency, dependent upon the nature of the music and ambient noise. However, from a long term perspective, the average gain may have a tilt based upon the music having less energy on average at higher frequencies than at lower frequencies. By adjusting the long term average gain applied to the output signal (as a function of frequency) to account for this slope, audible content such as music may be reproduced without being perceived as overly bright. To provide this functionality, the output of gain setter 208 is provided to a gain adjuster 210 that adjusts the determined gain values such that reproduced audible content has a perceived frequency balance that is approximately equivalent to the perceived frequency balance of the unaltered signal.

In some scenarios, operations of the gain adjuster 210 may be considered optional. Typically, ambient noise tends to have a power spectrum that decreases in magnitude with increasing frequency. Additionally, for environments with relatively high noise levels, the audio processing device 104 increases dynamic range compression applied, thereby reducing the difference in gain level applied between high and low frequencies. In such scenarios, gain setter 208 determines gains (to be applied across frequency) that have a relatively small change in slope across frequency. Additionally, in such situations, gain adjusting operations of the gain adjuster 210 may be reduced or not used.

In other scenarios, after being determined by gain setter 208, the gains may be processed by the optional gain adjuster 210 to constrain variations in the gains. For example, the gain adjuster 210 may provide a gain constraint such that (across the frequency spectrum) the average gain over time remains substantially constant and a significant slope in gain as a function of frequency is not experienced. By providing a substantially flat gain across frequency, audio signals may be reproduced in listening environments that are absent significant background noise (e.g., a residential home) with a desired output signal dynamic range that is substantially smaller than the input signal dynamic range such that relatively soft audio passages may be reproduced at a comfortable listening level while other passages are not excessively loud, and without substantially altering the perceived frequency balance of the output signal.

Figure 3:
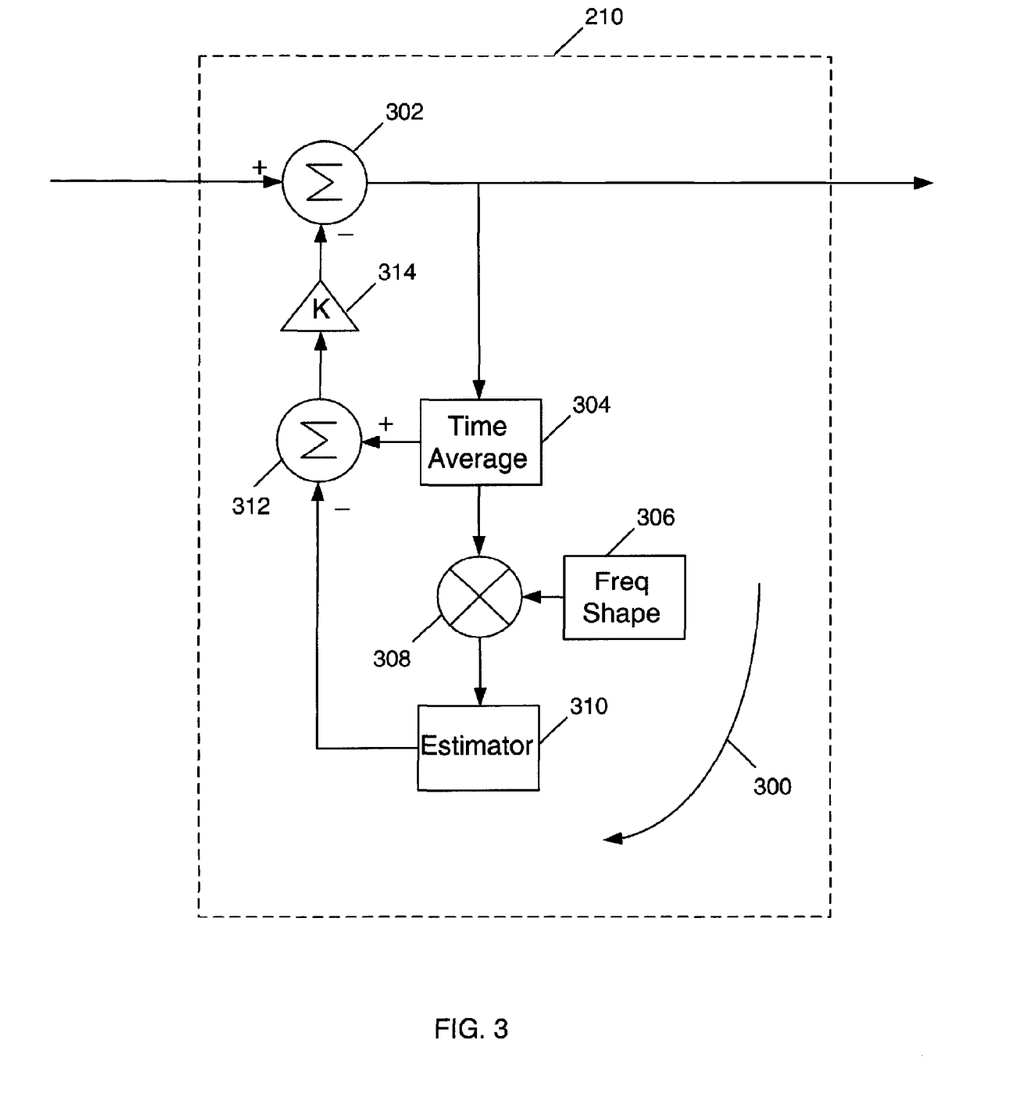
FIG. 3 is a block diagram of a gain adjuster.

Referring to FIG. 3, processing by the gain adjuster 210 is performed on gains determined for individual frequency bands of the audio signal frequency spectrum. In general, the gain adjuster 210 adjusts determined gains such that averaged over time, the gains are relatively flat across the frequency spectrum. To achieve this, the gain adjuster 210 may include a feedback path 300 that modifies the identified gains from the gain setter 208 (shown in FIG. 2). In some arrangements the feedback path 300 functions as a servo loop to flatten the determined gains over time. However, other techniques and methodologies may be implemented individually or in combination with the feedback path 300 to flatten gain as a function of frequency. For example, an open-loop feed-forward controller may be implemented to produce gain adjusting signals.

In the arrangement of FIG. 3, a servo loop is formed by a summer 302, a time averager 304 and another summer 312 and a gain stage 314. In general, operation of the servo loop including elements 302, 304, 312, and 314 causes the long term average gain of individual frequency bands to be substantially 0 dB (for a large value of feedback gain K provided by the gain stage 314). Instantaneously in time, the gain for each band may be allowed to vary depending upon on the instantaneous level of the reproduction signal (e.g., music) and ambient noise present. In some arrangements, additional servo loops may be implemented for processing gains associated with additional frequency bands. Assigning servo loops to respective frequency bands allows the spectrum of the long term average gains to be flattened as a function of frequency. Along with flattening long term average gains, the servo loops also drive the long term change in average gain in each frequency band to be 0 dB. As such, the Y intercept of a gain vs. frequency graph describing the output of the servo loops for all frequency bands is set to approximately zero dB.

The gain adjuster 210 further includes a frequency shaper 306, a multiplier 308 and an estimator 310 that attempt to maintain a long term average gain at the level provided by the gain setter 208, rather than setting it to 0 dB as described above, by estimating the DC value of the time average of the gain, and subtracting the DC value from the time averaged gain. By subtracting the quantities, the servo loop is made to be substantially insensitive to the DC gain value, and the gain difference is adjusted such that the gain has a flat long term average as a function of frequency. As such, the gain adjuster 210 provides a flattened long term average gain as a function of frequency, while also permitting an average gain that may substantially differ from 0 dB. The gain adjuster 210 also allows instantaneous gain variations that may diverge from the flattened average gain.

The summer 302 receives determined gains (for each frequency band) from the gain setter 208 and a feedback signal from the feedback path 300. From this input data, the summer 302 provides an output signal that represents one or more gains that on average can be substantially flat across the frequency bands.

To provide the feedback signal, the feedback path 300 includes a time averager 304 that averages the gain (output by the summer 302) for each frequency band to produce a time average of gain variations for each frequency band. By determining the difference between the time averaged gain (provided by time averager 304) and an estimate of the Y intercept of the time averaged gain as a function of frequency, and feeding back the difference in a negative manner, the gain provided by the gain setter 208 may be adjusted.

To provide an estimate of the Y intercept, the frequency shaper 306 provides one or more factors that are applied to the time averaged gains of the time averager 304 (via the multiplier 308). By applying the factors, the frequency shaper 306 may adjust the gain of each frequency band, thereby causing gains associated with some frequency bands to be influential while other gains are less significant. The factors used by the frequency shaper 306 may be based upon segmentation of the frequency bands, for example, factor values may be assigned based upon whether frequency bands are linearly spaced or logarithmically spaced. The shaping provided by the factors may also be used to eliminate extreme high and low frequency signal components, for example, for producing a robust estimate. In some arrangements, the frequency shaper 306 may use predefined factors (e.g., provided by a listener, stored in a memory (not shown), etc.) or obtained by other techniques and methodologies.

The estimator 310 included in the feedback path 300 calculates the estimated Y intercept value (e.g., mean value) of the output of the multiplier 308. In some arrangements, gains associated with each frequency band are used by the estimator 310 to determine a mean value of the time averaged gain across all of the frequency bands of the audio signal spectrum. In some arrangements gain values of some frequency bands may be excluded (e.g., values associated with higher and lower frequencies as weighted by the factors provided by the frequency shaper 306) from the estimation.

For the time averaged gain of each frequency band (provided by the time averager 304), a summer 312 subtracts the estimated mean value to adjust the long term average gains to have a zero mean value. By subtracting the estimated mean value from the time averaged and frequency shaped gain, the feedback path 300 drives the relatively long term average of the gain to be flat across frequency while allowing the average gain to differ from unity gain. As such, instantaneous variations in gain may diverge as needed to unmask audio signals from ambient noise levels while long term average gains are substantially flat across frequency to reduce upward gain slopes with increasing frequency.

The feedback path 300 also includes gain stage 314 that receives the difference of the time-averaged gain and the estimated mean value of the time averaged gain across frequency from the summer 312 and correspondingly applies a scale factor "K". The scaling factor may be substantially constant over the entire frequency spectrum or may vary with frequency. For example, scaling factors may be applied such that the probability of distortion or the appearance of oscillating signals (e.g., system ringing) is reduced. As the value of K is increased (for all frequencies similarly), the long term average gain is flattened with frequency. However, as K increases, the stability of the feedback path may be reduced. Choosing values of K typically includes a trade off between these two considerations. In some arrangements, a single value of K may be chosen for use within all modes of operation (e.g., low to high ambient noise environments), with prominence varying between background and foreground modes. The amount of frequency response flattening is chosen as a compromise to minimize the perception of frequency response changes across operating modes. Alternatively, K can be varied as operating conditions are varied (e.g. as prominence varies, as desired output dynamic range varies, or as other parameters of the system are varied such as the level of ambient noise present), if desired.

One or more techniques and methodologies may be implemented for triggering the operation of the gain adjuster 210. For example, if the received noise signal is below a particular threshold, the audio processing device 104 can classify the listening environment as being substantially absent background noise and thereby activate the gain adjuster 210. Upon detecting a significant background noise level, the gain adjuster 210 may be deactivated and gains identified by the gain setter 208 may be directly applied to appropriate frequency spectrum portions of the audio signal. In some arrangements the gain adjuster 210 may be continuously operated to allow the audio processing device 104 to operate over a relatively wide range of noise levels. For example, audio signals with noise levels ranging between an automobile with the engine off and windows shut to a car traveling at interstate speeds may be continuously processed without the need of activating or deactivating the gain adjuster 210.

The value of K can be used to activate or deactivate gain adjuster 210. For example, setting K to zero deactivates operation of the servo loop. Setting K to a desired value activates gain adjuster 210. In some arrangements, the factor "K" may also be dynamically adjusted as a function of ambient noise level. For example, the value of K is increased up to some desired max. value as the ambient noise level in the environment decreases. Similarly, the value of K is reduced as the ambient noise level in the environment increases, until K is set to zero at some desired high level of ambient noise. Alternatively, K can remain fixed, and provide a compromise for all modes of operation.

Returning to FIG. 2, upon being adjusted, the gain is output by the gain adjuster 210 to a combiner 212 and applied to the individual frequency bands of the audio signal. In this arrangement, the combiner 212 is implemented as a signal mixer that applies the gains to the appropriate frequency spectrum portions of the audio signal to produce an adjusted audio signal that is provided to another domain transferor 214. The audio signal (with the gain applied) may be provided to the noise estimator 200 in the time domain. For example, the output of the domain transferor 214 may be provided to the noise estimator 200. Typically, this second domain transferor 214 executes an inverse operation of the first domain transferor 202. For example, the domain transferor 214 may transform the audio signal frequency spectrum from the frequency domain to the time domain. The time domain audio signal is also provided to an output stage 216 to prepare the signal for delivery (e.g., to one or more speakers such as the speakers 106). For example, the output stage 216 may include one or more amplifiers, filters, impedance matching circuits or other type of circuitry for preparing audio signals for playback.

Figure 4:
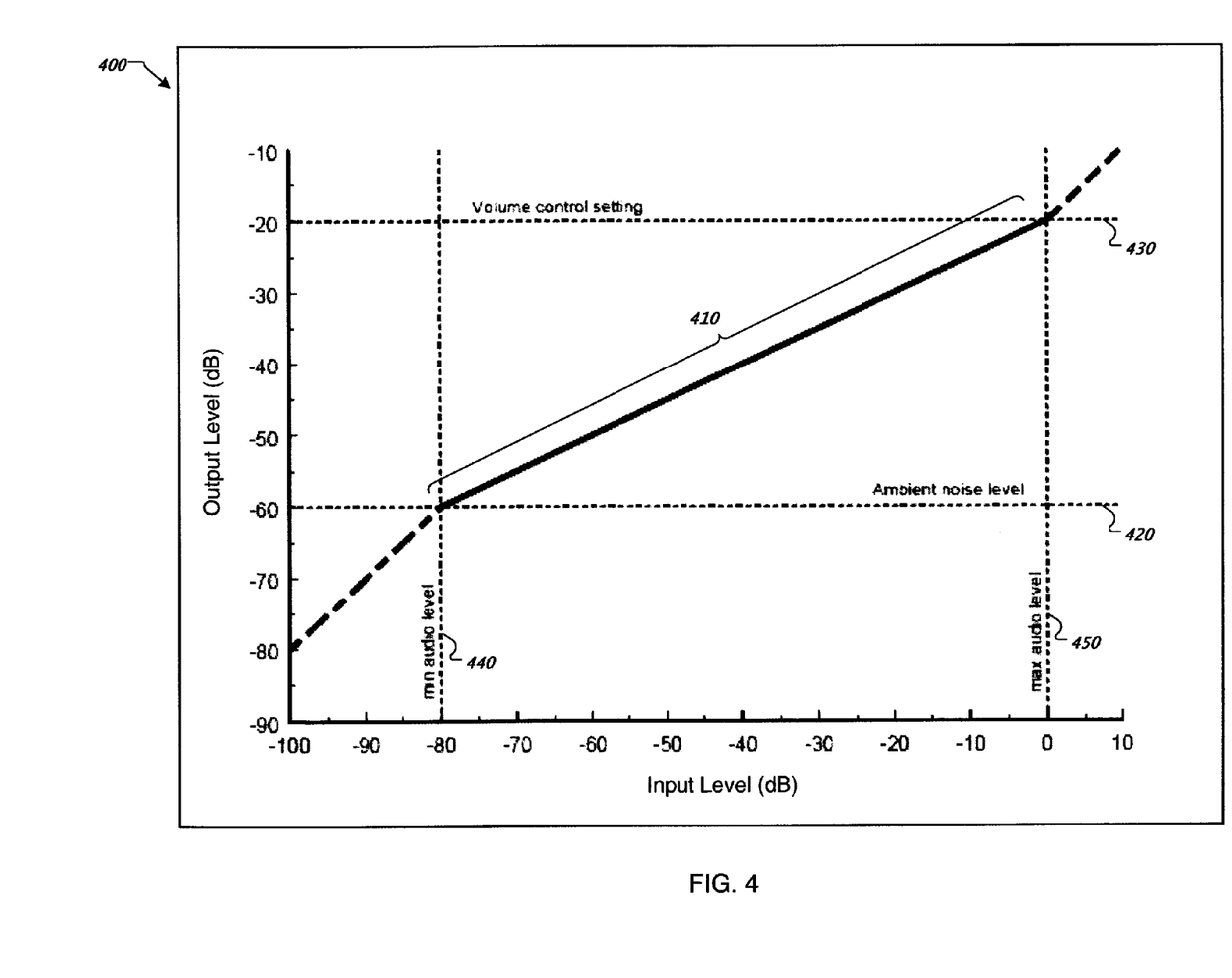
FIG. 4 is a chart representing output levels as a function of input levels.

Referring to FIG. 4, a chart 400 presents an exemplary input/output gain relationship (for one frequency band at one time instant) that may be used by the audio processing device 104 for determining gains to apply to audio signals from one or more sources. In this example, the input signal dynamic range is compressed to match an output signal dynamic range. However, in some arrangements, the input signal dynamic range may be expanded to fit into a desired output signal dynamic range. A line 410 represents the desired input/output gain relationship. For input levels within a range of 80 dB (e.g., −80 dB to 0 dB), a 40 dB compressed output range (e.g., −60 dB to −20 dB) is provided. As the line 410 illustrates, a substantially linear relationship (on the dB logarithmic scale) is provided within this range. In this example, for every 2 dB increase in input level, a 1 dB increase in output level is provided (i.e., a compression ratio of 2:1). In some arrangements, the input/output relationship may partially or completely deviate from a linear relationship and may include one or more piecewise linear portions or non-linear portions.

One or more types of information may be used to define the output signal dynamic range. For example, the output signal dynamic range may be based upon the level of ambient noise present in the environment, an input entered by a listener, and other information associated with the listening experience. For environments with noticeable background noise (e.g., the interior of the automobile 100), the ambient noise level and a desired prominence or volume level may be used to define the output signal dynamic range provided by the audio processing device 104. In other scenarios, in which ambient noise is substantially absent, the output signal dynamic range may be defined by the desired prominence level without information describing the ambient noise level. Regarding the scenario in which ambient noise is present, a minimum output signal level may be defined to be slightly greater than the noise level. As illustrated by dashed-line 420, a maximum ambient noise level of −60 dB defines the minimum output signal limit. Similarly, dashed-line 430 represents an upper output signal limit of −20 dB. Dashed line 430 may be obtained from the prominence or volume control setting. Dashed line 430 represents the maximum desired output signal level, which is controlled by the user. In general, the output signal dynamic range is determined by the difference between the upper output signal limit represented by the dashed-line 430 and the lower signal limit represented by the dashed line 420. In the example illustrated in FIG. 4, the output signal dynamic range is 40 dB. To determine the gain applied to an input signal, the intercept of a line extending up vertically from the input signal value of interest with the line 410 is identified. The Y value of this intersection point may be determined by extending a line horizontally to the Y axis (labeled Output Level (dB)). The difference between this Y axis value and the input signal value is the gain to be applied. For example, for an input signal of −60 dB, using line 410, a Y axis value of −50 dB is identified. Therefore, the −60 dB input signal needs an applied gain of 10 dB to achieve the output signal level of −50 dB. Note that while the discussion generally uses the term gain, the input/output relationship may specify that a signal be attenuated (e.g., a gain of less than 1 or less than 0 dB may be applied).

One or more types of information may be used to define the upper limit and lower limits that are represented by the dashed lines 430 and 420. For example, the upper limit may be based upon a prominence or volume control setting selected the listener (via the in-dash control panel 110). Typically, the setting is selected for providing an equivalent volume across the entire frequency spectrum for an audio signal, however, in some arrangements, different volume settings may be selected for different frequency bands of the frequency spectrum. For example, a dynamic equalization function may be incorporated into a volume or prominence control (e.g., prominence control 111), which adjusts the overall system frequency response as a function of the control setting and may provide a loudness compensation function, in which low frequencies are emphasized relative to mid and high frequencies (for lower settings of the volume or prominence control). Similarly, ambient noise levels may be used for setting the lower limit of the desired output signal dynamic range. For example, the lower limit may be set for a value approximately equivalent to the measured or estimated ambient noise level. The lower limit may also be offset above or below the ambient noise level, for example, depending upon how far above or below the noise level is acceptable for audio signal reproduction. For example, setting the lower limit above the noise level reduces the possibility the signal may be masked by the noise. However, such a setting may limit the lowest level at which the signal can be effectively reproduced or may compress the signal beyond a desirable amount. Also illustrated in the figure, a dashed-line 440 represents the minimum input signal level (for this frequency band) and a dashed-line 450 represents the maximum input signal level.

In some arrangements, one or more of the quantities (e.g., represented by dashed lines 420, 430, 440 and 450) that define the dynamic range may be dynamically change and cause the dynamic range to be redefined. For example, the minimum output signal limit (represented by dash-line 420), may vary as a function of the ambient noise level such that the limit increases as the noise level increases and correspondingly decreases as the noise level decreases. For such an arrangement, and in which the setting of the volume or prominence control remains constant, the slope of the I/O curve (represented by line 410) is allowed to dynamically change as the noise level varies.

The output signal dynamic range may be defined similarly or differently for each frequency band processed by the audio processing device 104. In some examples, an output signal dynamic range may be defined for compressing input signal levels in one frequency band (within the audible range) while another output signal dynamic range may be defined for expanding input signal levels in another frequency band. Similarly, different output signal dynamic ranges may be defined based upon the different ambient noise levels present in frequency bands. While static output dynamic ranges may be defined, output dynamic ranges may also be dynamically adjusted with time. For example, as the ambient noise level changes (e.g., as the automobile 100 is driven from a noisy urban environment to a quiet rural environment), output signal dynamic range may be re-defined to account for the decreasing (or increasing) noise levels.

Various techniques and methodologies may be implemented to identify dynamic range limits. For example, to define a minimum output level, an ambient noise level may be sensed by one or more detection techniques, such as measurements provided by a microphone, an accelerometer, etc., or estimated by analytical techniques individually or in combination with detection techniques. Along with the in-dash control panel 110 providing a prominence or volume control setting, other techniques may be used for defining a maximum output level. For example, a maximum level may be pre-defined based upon the environment (e.g., maximum volume threshold for not distracting a driver). Similarly, a maximum level may be defined as the maximum reproducible output level with an acceptable amount of distortion. In some arrangements, a user may define dynamic range via a user control or by another similar methodology such as by initiating a signal (e.g., a wireless signal) from a device (e.g., cellular telephone, MP3 player, etc.) for defining dynamic range limits.

In one exemplary arrangement, a single prominence control (e.g., prominence control 111) is provided to the user. The prominence control can be continuously adjusted among settings configured for background reproduction and settings configured for foreground reproduction. The control may simultaneously define a desired average reproduction level and a desired output signal dynamic range. By using the control to transition operation from the foreground to the background, the average reproduction level is gradually reduced along with the output signal dynamic range. Typically for background operation, the average level ideally is low, but perceivable, and the dynamic range is sufficiently reduced so that both relatively quiet and louder passages in the input signal are still audible. For foreground operation, little (if any) compression is applied to the input signal (or the output signal dynamic range may be expanded relative to the input signal dynamic range), and the output signal is reproduced at an average level sufficiently large so that quiet passages are audible.

Some implementations of the system may include a prominence control as described above, but may not include an ambient noise sensor (for estimating ambient noise levels). For applications and environments in which high levels of ambient noise are not expected (e.g., a consumer's living room), sensing the level of noise may not be needed. A minimum output level, which may be arbitrary, can be determined in advance and remain fixed. Operation of the control may then adjust the average reproduction level and output dynamic range so that the output signal remains near or above the set minimum output level. The minimum output level may be set to approximate the typical noise floor expected in the operating environment of the system. Alternatively, a fixed minimum output signal level may be absent. The control operated by the user (e.g., prominence control 111) just varies simultaneously the average reproduction level and output signal dynamic range as previously described.

Alternatively, some implementations may combine a prominence control (e.g., prominence control 111) with an ambient noise sensor (or use a method to estimate ambient noise). The minimum output signal level may be determined based upon the ambient noise signal present in the environment, and may be adjusted to track noise changes with time. As such, a prominence control that adjusts output signal dynamic range may provide a maximum output signal level that varies as noise levels change to maintain the set dynamic range.

The output signal dynamic range may be determined by one or more methodologies and techniques. For example, output signal dynamic range may be defined as the difference between the minimum and maximum output signal levels. By setting any two of these three parameters (i.e., minimum output signal, maximum output signal, dynamic range), the third may be determined. A prominence control could operate by setting both minimum and maximum output signal levels (thereby defining the output signal dynamic range). Alternatively, a prominence control may determine a minimum output signal level and a desired dynamic range, thereby defining the maximum output signal level, or by determining the maximum output signal level and the dynamic range, the minimum output signal level may be defined. For the case in which an ambient noise sensor is not used, the minimum output signal level can be arbitrarily set to a fixed value. In such a situation, the prominence control may directly adjust the maximum output signal level allowed or the output signal dynamic range. Rather than a single prominence control, multiple controls could be provided to allow independent control of average volume level and output signal dynamic range, if desired.

A user selected maximum output level technique may be used if the selected maximum output level is significantly larger than the ambient noise level. For situations when the noise level is significantly large compared to the selected maximum output level, the user may be requested to select a minimum output level and a fixed dynamic range may be applied to define the maximum output level. Since noise levels may dynamically change, the audio processing device 104 may switch between two user selection methodologies in response to the changing noise levels.

Figure 5:
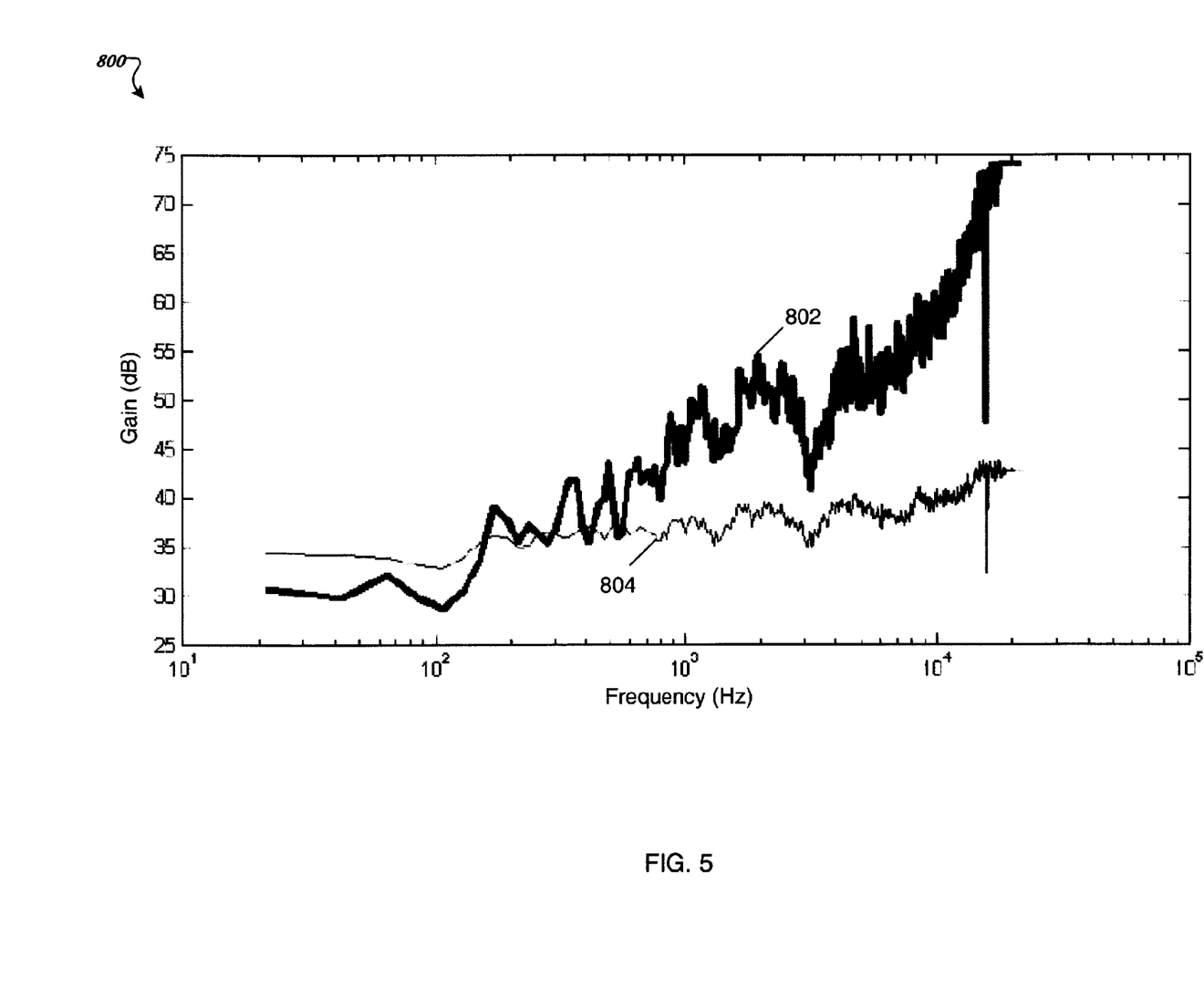
FIGS. 5 and 6 are gain charts.

Referring to FIG. 5, a graph 800 includes two traces 802, 804 that represent the applied gain as a function of frequency. In particular, the trace 802 represents the applied gain for the situation in which the gain adjuster 210 is deactivated. Correspondingly, the trace 804 represents the applied gain for the situation in which the gain adjuster is activated. Both of the traces 802, 804 represent gains for a low ambient noise environment. As represented by the trace 802, a large range of gains are applied to the audio signal that may be inappropriate for the low noise environment. By activating the gain adjuster 210, as represented by the trace 804, the tilt in the gain applied as a function of frequency is substantially removed.

Figure 6:
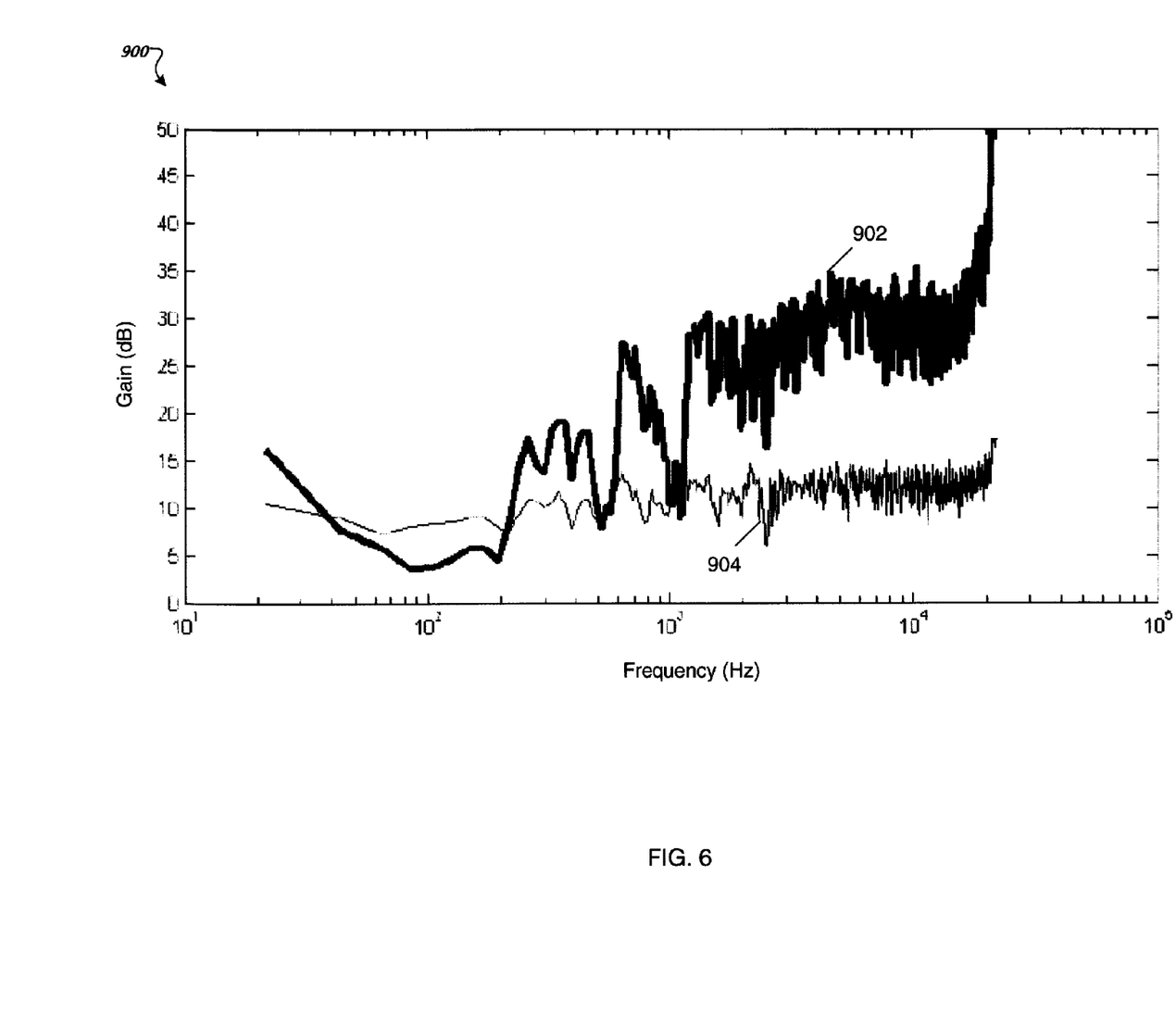

Referring to FIG. 6, a chart 900 includes two traces 902, 904 that represent gains applied to an audio signal of a musical piece. The trace 902 represents gains applied by the audio processing device 104 when the gain adjuster 210 is deactivated while the trace 904 represents applied gains for the situation in which the gain adjuster is activated. In this example, the gains are applied to audio signals being reproduced in a higher ambient noise listening environment than the environment of FIG. 5. The trace 902 shows the gains applied as a function of frequency absent the operation of the gain adjuster 210. While the gain curve is not completely flat, it is does not have quite the large degree of tilt as a function of frequency of the trace 802 of FIG. 5. As represented by the trace 904, the system still benefits from the operation of the gain adjuster 210 under these conditions. In particular, the trace 904 is substantially flatter as a function of frequency compared to the trace 902, even in the presence of noise.

Figure 7:
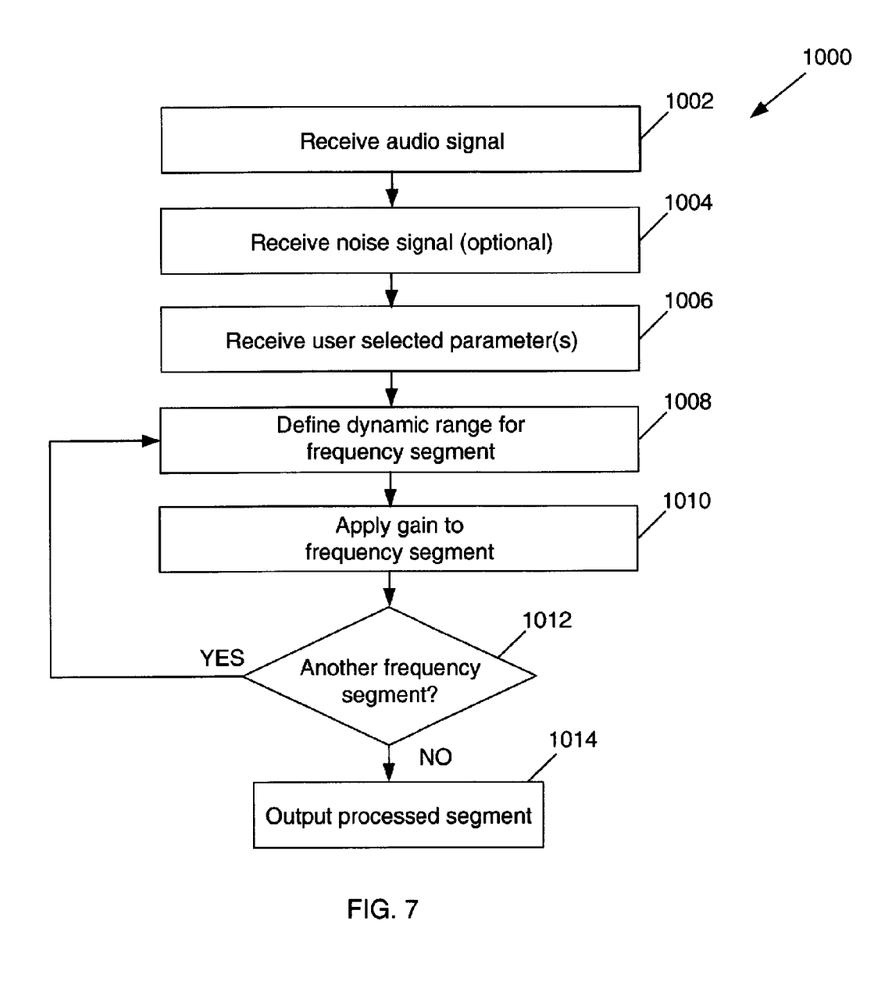
FIG. 7 is a flow chart.

Referring to FIG. 7, a flowchart 1000 lists some operations of the audio processing device 104 for adjusting dynamic range. Operations include receiving 1002 an audio signal from an audio source such as a radio tuner, a CD player, a DVD player, a digital audio decoder, a microphone, a communications system, or other types of source. Operations also include optionally receiving 1004 a noise signal, for example, from one or more microphones located in or near the listening environment. In some arrangements, one or more microphones may be dedicated for the purpose of noise detection, or they may be shared (e.g., with a hands free cell phone system, a voice command system). In some examples, the noise signal may be obtained from a wireless source such as the microphone in a cellular telephone. Operations also include receiving 1006 one or more user selected parameters. In some arrangements, the user may provide two parameters for defining a desired dynamic range of an output signal. For example, a pair of parameters (e.g., two parameters selected from a list that includes output signal dynamic range, maximum desired output signal level and minimum output signal level) may be used for defining dynamic range. Other methodologies and techniques may also be used for defining dynamic range and individual parameters, for example, the minimum output signal level may be set to offset (by a predefined amount) the noise level.

The dynamic range of the output audio signal for a frequency segment (e.g., a frequency band) is defined during an operation 1008. In some arrangements, the dynamic range may be defined by a combination of information that includes that audio signal levels, the ambient noise signal level, and the user selected output level. For example, the noise signal level may define the lower output level and the user selected output level may define the upper output signal level as illustrated in input/output signal relationship of FIG. 4.

Operations also include applying 1010 a gain to the frequency segment of the audio signal. In some implementations, the gain may be applied such that the frequency segment may be determined to comply with a desired input/output relationship.

Operations also include determining 1012 if another frequency segment of the audio signal is present for gain application. If present, operations include returning to define 1008 the output signal dynamic range for the next segment. If no additional frequency segments are present, operations include outputting 1014 the processed frequency segment. To output the frequency segment of the audio signal, additional operations such as transforming the frequency segment into the time domain and other processing may be executed.

The techniques described herein can be implemented in digital electronic circuitry, or in computer hardware, firmware, software, or in combinations of them. Analog equipment and hardware may also be implemented. For examples, filters and filter banks may be used to decompose noise and program signals into frequency bands. The operations described above may be performed using analog functional blocks such as variable gain elements, multipliers, level detectors, etc. The techniques can be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps of the techniques described herein can be performed by one or more programmable processors executing a computer program to perform functions of the invention by operating on input data and generating output. Method steps can also be performed by, and apparatus of the invention can be implemented as, special purpose logic circuitry, e.g., an FPGA (field programmable gate array) or an ASIC (application-specific integrated circuit). Modules can refer to portions of the computer program and/or the processor/special circuitry that implements that functionality.

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

To provide for interaction with a user, the techniques described herein can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer (e.g., interact with a user interface element, for example, by clicking a button on such a pointing device). Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The techniques described herein can be implemented in a distributed computing system that includes a back-end component, e.g., as a data server, and/or a middleware component, e.g., an application server, and/or a front-end component, e.g., a client computer having a graphical user interface and/or a Web browser through which a user can interact with an implementation of the invention, or any combination of such back-end, middleware, or front-end components. The components of the system can be interconnected by any form or medium of digital data communication, e.g., a communication network. Examples of communication networks include a local area network ("LAN") and a wide area network ("WAN"), e.g., the Internet, and include both wired and wireless networks.

The computing system can include clients and servers. A client and server are generally remote from each other and typically interact over a communication network. The relationship of client and server arises by virtue of computer programs running on the respective computers and having a client-server relationship to each other.

Other embodiments are within the scope of the following claims. For example, the techniques described here can be used in a wide variety of environments not limited to vehicle interiors residential homes, including restaurants, concert halls, and other types of venues. The techniques described herein can be performed in a different order and still achieve desirable results.

What is claimed is:

1. A method of adjusting a dynamic range of an audio system comprising:
provide an audio system that includes variable values for at least the following parameters: (i) an output signal dynamic range, (ii) a maximum output signal level, and (iii) a minimum output signal level;
receiving a user specified value for at least a first of the parameters;
determining a value of a second of the parameters, wherein the determined value of the second parameter is based at least in part on the user-specified value of the first parameter, and
applying a gain to an input signal as a function of time to compress the input signal to fit within a value set for the output signal dynamic range parameter, wherein the input signal is divided into a plurality of frequency bands and a gain is applied to the input signal in each frequency band to compress the input signal to fit within an output signal dynamic range set for each frequency band, and wherein the gain applied to each frequency band is adjusted by a negative feedback servo loop wherein the servo loop computes the time average of the gains, scales the time averaged gains, and subtracts the scaled, time averaged gains from the gains applied to each frequency band, to reduce tilt across frequency of the long term average gains of individual frequency bands.

2. The method of claim 1 wherein the first parameter specified by the user is the maximum output signal level.

3. The method of claim 1 wherein first parameter specified by the user is the output signal dynamic range.

4. The method of claim 1 wherein the minimum output signal level is based on the level of ambient noise present in the listening environment.

5. The method of claim 4 wherein the level of ambient noise present in the environment is either directly sensed by a microphone or is estimated.

6. The audio system of claim 4 wherein the level of ambient noise present in the environment is either directly sensed by a microphone or is estimated.

7. The method of claim 1 in which the feedback signal is based on averaging applied gains across adjacent frequency ranges.

8. The audio system of claim 1 wherein the first parameter specified by the user is the maximum output signal level.

9. The audio system of claim 1 wherein first parameter specified by the user is the output signal dynamic range.

10. The audio system of claim 1 wherein the minimum output signal level is based on the level of ambient noise present in the listening environment.

11. A method for controlling operation of an audio system comprising:
Simultaneously controlling with a single control two of the following three parameters:
(i) an output signal dynamic range, (ii) a maximum output signal level, and (iii) a minimum output signal level.

12. The method of claim 11 wherein the output signal dynamic range and the maximum output signal level are simultaneously controlled.

13. An apparatus for controlling operation of an audio system comprising:
a single control that simultaneously controls two of the following three parameters:
(i) an output signal dynamic range, (ii) a maximum output signal level, and (iii) a minimum output signal level.

14. The method of claim 13 wherein the controller simultaneously controls the output signal dynamic range and the maximum output signal level.

15. An audio system comprising:
a user control for receiving a user specified value for at least one of a plurality of parameters consisting of (i) an output signal dynamic range, (ii) a maximum output signal level, and (iii) a minimum output signal level;
a processor for determining a value of a second of the parameters, wherein the determined value of the second parameter is based at least in part on the user-specified value of the first parameter, and
gain determining elements for determining a gain to apply to an input signal to compress the input signal to fit within a value set for the output signal dynamic range parameter, wherein the gain is a function of time, to divide the input signal into a plurality of frequency bands, to apply a gain to the input signal in each frequency band to compress the input signal to fit within an output signal dynamic range set for each frequency band, and
a negative feedback servo loop to adjust computes the time average of the gains, scales the time averaged gains, and subtracts the scaled, time averaged gains from the gains applied to each frequency band, to reduce tilt across frequency of the long term average gains of individual frequency bands.

* * * * *